United States Patent
Yoo

(10) Patent No.: US 6,670,835 B2
(45) Date of Patent: Dec. 30, 2003

(54) DELAY LOCKED LOOP FOR CONTROLLING PHASE INCREASE OR DECREASE AND PHASE CONTROL METHOD THEREOF

(75) Inventor: Chang-sik Yoo, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/079,316

(22) Filed: Feb. 20, 2002

(65) Prior Publication Data

US 2002/0153929 A1 Oct. 24, 2002

(30) Foreign Application Priority Data

Apr. 20, 2001 (KR) .................................. 10-2001-0021363

(51) Int. Cl.[7] .................................................. H03L 7/06
(52) U.S. Cl. ...................... 327/158; 327/159; 327/276; 327/277
(58) Field of Search ................................ 327/156, 158, 327/159, 161, 269, 276, 277, 284

(56) References Cited

U.S. PATENT DOCUMENTS 5,771,264 A * 6/1998 Lane ........................... 375/376
6,137,327 A * 10/2000 Schnell ........................ 327/158
6,388,482 B1 * 5/2002 Schnell et al. ............... 327/158
6,456,130 B1 * 9/2002 Schnell ........................ 327/156

* cited by examiner

Primary Examiner—Timothy P. Callahan
Assistant Examiner—An T. Luu
(74) Attorney, Agent, or Firm—Myers Bigel Sibley Sajovec PA

(57) ABSTRACT

A delay locked loop which is capable of adjusting the number of delay devices in a delay line and controlling a phase increase or decrease more precisely than the adjustment by the number of delay devices and a phase control method thereof are provided. The delay locked loop includes a phase detector, a delay line, and a delay time adjuster. The phase detector compares the phase of a reference clock signal with the phase of a feedback clock signal and outputs the phase difference between the reference clock signal and the feedback clock signal as an error control signal. The delay line includes a plurality of first delay devices having a fixed delay time and connected in series. The number of first delay devices connected in series is adjusted in response to a shift signal. The delay line receives an input clock signal and outputs an output clock signal. The delay time adjuster controls a delay time in response to the reference clock signal and the error control signal generated from the phase detector, generates the input clock signal and adjusts the number of first delay devices.

11 Claims, 6 Drawing Sheets

DELAY LOCKED LOOP FOR CONTROLLING PHASE INCREASE OR DECREASE AND PHASE CONTROL METHOD THEREOF

RELATED APPLICATIONS

The present application claims priority from Korean Application Serial No. 2001-0021363 filed Apr. 20, 2001, the disclosure of which is incorporated herein by reference as if set forth fully herein.

FIELD OF THE INVENTION

The present invention relates to semiconductor circuits, and more particularly, to delay locked loops.

BACKGROUND OF THE INVENTION

Delay locked loops (DLLs) are clock recovery circuits for precisely synchronizing the phase of an internal clock with the phase of an external clock and are widely applied to the next generation of memories or system integrated circuits, such as synchronous dynamic random access memories (SDRAMs) or double data rate (DDR) SDRAMs.

In order to precisely synchronize the phase of an internal clock with the phase of an external clock, a phase synchronization device, such as a phase locked loop (PLL), or a DLL is typically used. Where the frequency of an external clock is different from the frequency of an internal clock, a PLL having a frequency multiplication function can be used. On the other hand, where the frequency of an external clock is the same as that of an internal clock, a DLL can be used. Unlike a PLL, a DLL, typically, does not have a problem with phase noise accumulating and, thus, is advantageous in decreasing the jitter of an internal clock. Therefore, where frequency multiplication is not necessary, it is very common to generate an internal clock using a DLL.

There are various types of DLLs including open loop type DLLs, such as synchronous mirror delays (SMDs), and closed loop type DLLs. In the case of open loop type DLLs, the locking time may be very short, but phase error may be high. Thus, it may be difficult to use the open loop type DLLs for high frequency clocks.

In order to obtain a desired delay time in a closed loop type DLL, the number of delay devices or the delay time of each of the delay devices can be adjusted. To obtain a desired delay time by adjusting the number of delay devices, a desirable delay time can be obtained by including a large number of delay devices. Such may be the case even though the frequency of an input clock varies across a wide range. For example, in order to obtain a delay time equivalent to the period of an input clock if the delay time of a delay device is 500 ps, 40 delay devices are required for an input clock with a frequency of 50 MHz, and 8 delay devices are required for an input clock with a frequency of 250 MHz. However, the accuracy of the delay time that can be adjusted is substantially equal to the delay time of a delay device, that is, 500 ps, and, thus, it may be very difficult to precisely adjust phase.

In a DLL using a large number of delay devices, the delay time of a delay device becomes the minimum locking resolution of the DLL. Thus, in order to obtain precise locking characteristics, the delay time of a delay device should be small. However, in order to sufficiently cover a maximum operation clock cycle time, the number of delay devices should be large. Thus, the length of a delay line consisting of the delay devices increases. Accordingly, increased layout area and power consumption may result. For example, if a maximum operation clock period is 20 ns, at least 1000 delay devices may be required to ensure a locking resolution of 20 ps.

When a desired delay time is provided by adjusting the delay time of each delay device, the accuracy of the delay time that can be adjusted can be considerably enhanced. For example, by adjusting the delay time using an analog voltage, an infinitely great accuracy can theoretically be obtained. However, the range in which the delay time of a delay device can be adjusted is limited, and thus, where the frequency of an input clock varies across a wide range, a desired delay time may be unattainable. For example, where there are 20 delay devices, and the delay time of one of the twenty delay devices varies between 200 ps and 500 ps, in order to obtain a delay time equivalent to the period of an input clock, one of the twenty delay devices must have a delay time of 1 ns for an input clock with a frequency of 50 MHz; however, a delay time of 1 ns is beyond the delay time range of the delay devices.

SUMMARY OF THE INVENTION

Embodiments of the present invention provide a delay locked loop according to the present invention including a phase detector, a delay line, and a delay time adjuster. The phase detector is configured to compare the phase of the reference clock signal with the phase of the feedback clock signal and outputting a value corresponding to a difference between the phase of the reference clock signal and the phase of the feedback clock signal as an error control signal. The delay line includes a plurality of first delay devices having a fixed delay time, selectively connected in series, and configured to adjust the number of first delay devices connected in series in response to a shift signal and to generate an output clock signal in response to an input clock signal. The delay time adjuster is configured to receive the reference clock signal and variably delay the reference clock signal in response to the error control signal to generate the input clock signal and the shift signal.

In further embodiments of the present invention, a delay compensation circuit is configured to compensate for the phase difference between the output clock signal and the feedback clock signal.

In additional embodiments of the present invention, the delay time adjuster includes a variable delay device configured to receive the reference clock signal and variably delay the reference clock signal in response to the error control signal so as to generate a variable delay signal. A maximum variable delay device is configured to receive the reference clock signal and delay the reference clock signal by a delay amount corresponding to the maximum delay time of the variable delay device to generate a maximum delay clock signal. A minimum variable delay device is configured to receive the reference clock signal and delay the reference clock signal by a delay amount corresponding to the minimum delay time of the variable delay device to generate a minimum delay signal. A multiplexer selects one signal from the variable delay signal, the maximum delay clock signal, and the minimum delay signal as the input clock signal. A controller is configured to compare a variable delay clock signal, generated by delaying the variable delay signal the fixed delay time, with the maximum delay clock signal and a minimum delay clock signal, generated by delaying the minimum delay signal twice the fixed delay time, to generate a shift signal and a selection signal that controls the multiplexer.

Additionally, the fixed delay time of the first delay devices may be less than a difference between the maximum delay time to which the maximum variable delay device delays the phase of the reference clock signal and the minimum delay time to which the minimum variable delay device delays the phase of the reference clock signal. The controller may be further configured to control the shift signal to increase the number of first delay devices by one if the variable delay clock signal is behind the minimum delay clock signal and control the shift signal to decrease the number of first delay devices by one if the variable delay clock signal is ahead of the maximum delay clock signal. The controller may also be configured to control the selection signal to select the minimum delay signal as the input clock signal when the shift signal is controlled to increase the number of first delay devices by one and to control the selection signal to select the maximum delay clock signal as the input clock signal when the shift signal is controlled to decrease the number of first delay devices by one.

In still further embodiments of the present invention, each of the first delay devices in the delay line receives the input clock signal and a first input signal, selects one signal from the input clock signal and the first input signal, and supplies the selected signal to the next first delay device as the first input signal. The output of a final first delay device in the delay line is generated as an output clock signal.

In other embodiments of the present invention, a delay locked loop including a delay line in which a plurality of first delay devices having a fixed delay time are connected in series. The phase of a reference clock signal is compared with the phase of a feedback clock signal and the phase difference between the reference clock signal and the feedback clock signal output as an error control signal. An input clock signal is provided to the delay line by receiving the reference clock signal and variably delaying the reference clock signal in response to the error control signal. A shift signal for controlling the number of first delay devices connected in series is generated and an output clock signal is generated utilizing the delay line based on the input clock signal and the shift signal.

The input clock signal may be generated by variably delaying the reference clock signal in response to the error control signal to provide a variable delay signal. The reference clock signal is delayed by as much as the maximum delay time to which the variable delay signal can be delayed to provide a maximum delay clock signal. The reference clock signal is also delayed by as much as the minimum delay time to which the variable delay signal can be delayed to provide a minimum delay signal. The variable delay clock signal, generated by delaying the variable delay signal an amount corresponding to the delay of one of the first delay devices to delay the variable delay signal, is compared with the maximum delay clock signal and a minimum delay clock signal, generated by delaying the minimum delay signal an amount corresponding to a delay of two of the first delay devices to delay the minimum delay signal, and a shift signal and a selection signal generated. One signal from the variable delay signal, the maximum delay clock signal, and the minimum delay signal is selected in response to the selection signal to provide the selected signal as the input clock signal.

Furthermore, a number of first delay devices utilized in the delay line may be increased by one if the variable delay clock signal is behind the minimum delay clock signal. The minimum delay signal is selected as the input clock signal if the variable delay clock signal is behind the minimum delay clock signal. The number of first delay devices utilized in the delay line may be decreased by one if the variable delay clock signal is ahead of the maximum delay clock signal. The maximum delay clock signal is selected as the input clock signal if the variable delay clock signal is ahead of the maximum delay clock signal.

Additionally, a fixed delay time of the first delay devices may be less than the difference between the maximum delay clock signal and the minimum delay signal.

BRIEF DESCRIPTION OF THE DRAWINGS

Embodiments and aspects of the present invention are described with reference to the attached drawings in which.

DETAILED DESCRIPTION OF THE INVENTION

Figure 1:
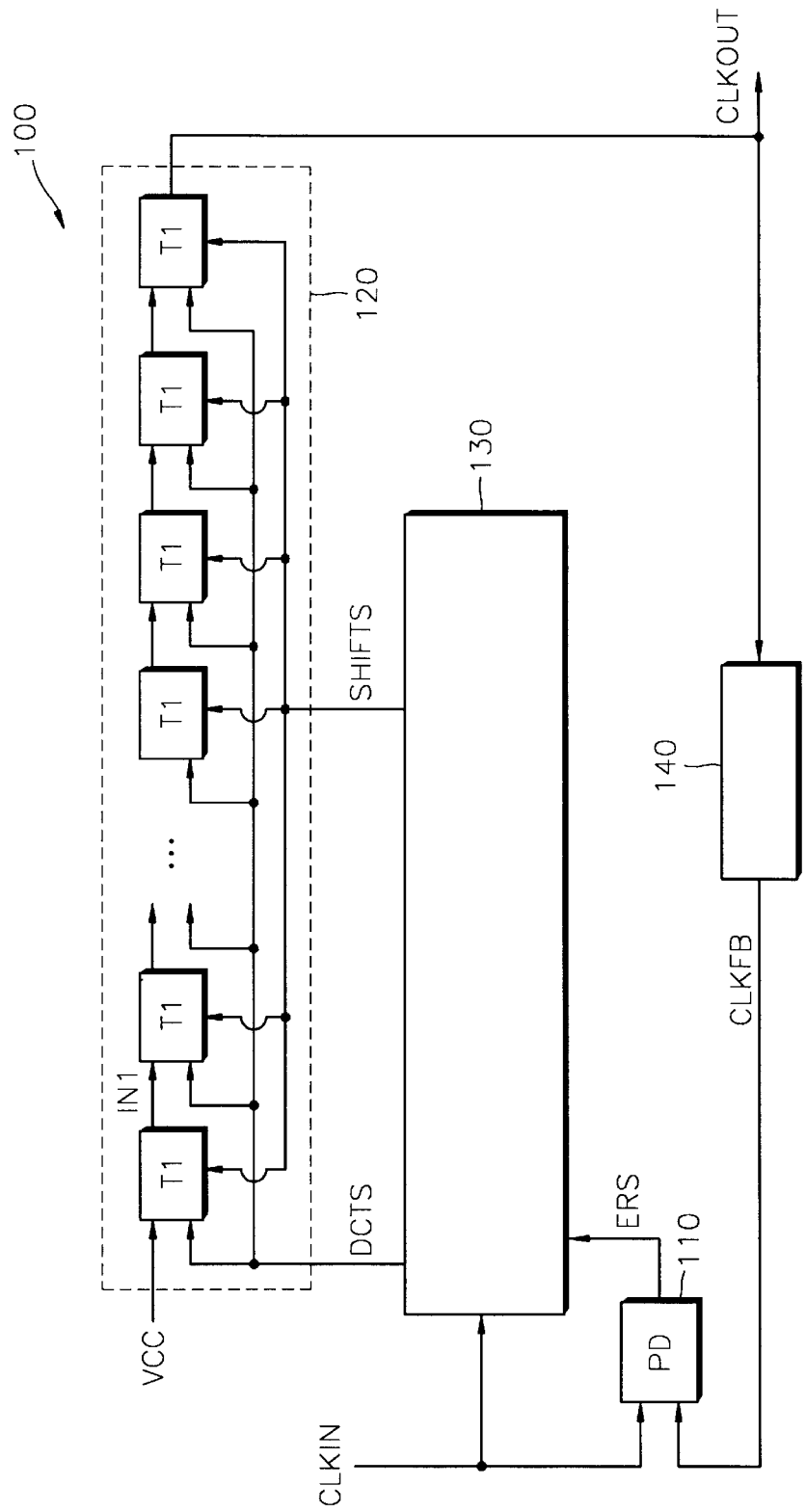
FIG. 1 is a block diagram illustrating a delay locked loop according to embodiments of the present invention.

The present invention will now be described more fully with reference to the accompanying drawings, in which preferred embodiments of the invention are shown. The same reference numerals in different drawings represent the same element, and thus their description will be omitted.

Referring to FIG. 1, a delay locked loop (DLL) 100 according to embodiments of the present invention which receives a reference clock signal CLKIN and synchronizes the phase of a feedback clock signal CLKFB with the phase of the reference clock signal CLKIN includes a phase detector 110, a delay line 120, and a delay time adjuster 130.

The phase detector 110 compares the phase of the reference clock signal CLKIN with the phase of the feedback clock signal CLKFB and outputs the difference between the phases of the reference clock signal CLKIN and the feedback clock signal CLKFB as an error control signal ERS.

The delay line 120 includes a plurality of first delay devices T1 each having a predetermined delay time and connected in series. The delay line 120 adjusts the number of first delay devices T1 connected in series in response to a shift signal SHIFTS, receives an input clock signal DCTS, and generates an output clock signal CLKOUT.

The delay time adjuster 130 receives the reference clock signal CLKIN, delays the reference clock signal CLKIN a variable delay time in response to the error control signal ERS and generates the input clock signal DCTS and the shift signal SHIFTS, to thereby increase and/or decrease the phase more precisely than is provided by the first delay devices T1 alone.

The delay locked loop 100 may also include a delay compensation circuit 140 that compensates for the phase difference between the output clock signal CLKOUT, which may be a clock signal actually used in a chip, and the feedback clock signal CLKFB.

Hereinafter, the operation of the delay locked loop 100 according to embodiments of the present invention will be described in detail with reference to FIG. 1.

The phase detector 110 compares the phase of the reference clock signal CLKIN with the phase of the feedback clock signal CLKFB and outputs the phase difference between the reference clock signal CLKIN and the feedback clock signal CLKFB as the error control signal ERS.

The delay time adjuster 130, receives the reference clock signal CLKIN, generates the input clock signal DCTS, which is a variably delayed reference clock signal, and generates the shift signal SHIFTS for selecting the number of first delay devices T1 in response to the error control signal ERS, thereby increasing/decreasing the phase more precisely than is provided by the first delay devices T1. The delay time adjuster 130 will be described more fully with reference to FIG. 2.

Returning to FIG. 1, in the delay line 120, the first delay devices T1 having a predetermined delay time and are connected in series. Each of the first delay devices T1 receives the input clock signal DCTS and a first input signal IN1, selects either the input clock signal DCTS or the first input signal IN1 in response to the shift signal SHIFTS, and inputs the selected signal as the first input signal IN1 of the next first delay device T1. The output of a final first delay device T1 is the output clock signal CLKOUT. The first input signal IN1 of a leading first delay device T1 is not selected, and thus power supply voltage Vcc, ground voltage, or an arbitrary signal may be connected to the leading first delay device T1.

Each of the first delay devices T1 includes a shift register (not shown). It is determined which of the first delay devices T1 the input clock signal DCTS is input depending on the state (high or low) of the shift signal SHIFTS. A logic high value of the shift signal SHIFTS is provided as input of the one of the first delay devices T1 which is to receive the input clock signal DCTS as input. The shift signals SHIFTS of the other first devices T1 are logic low. In other words, each of the first delay devices T1 receives the first input signal IN1 output from a previous first delay device T1 as input except for the leading first delay device T1, which receives the input clock signal DCTS as input. The number of first delay devices T1 can be increased or decreased by adjusting the state of the shift signal SHIFTS.

A clock signal output from the delay locked loop 100, which may be used in a chip, is the output clock signal CLKOUT. However, the delay compensation circuit 140, which compensates for the phase difference between the output clock signal CLKOUT and the feedback clock signal CLKFB, may be further included in the delay locked loop 100.

Figure 2:
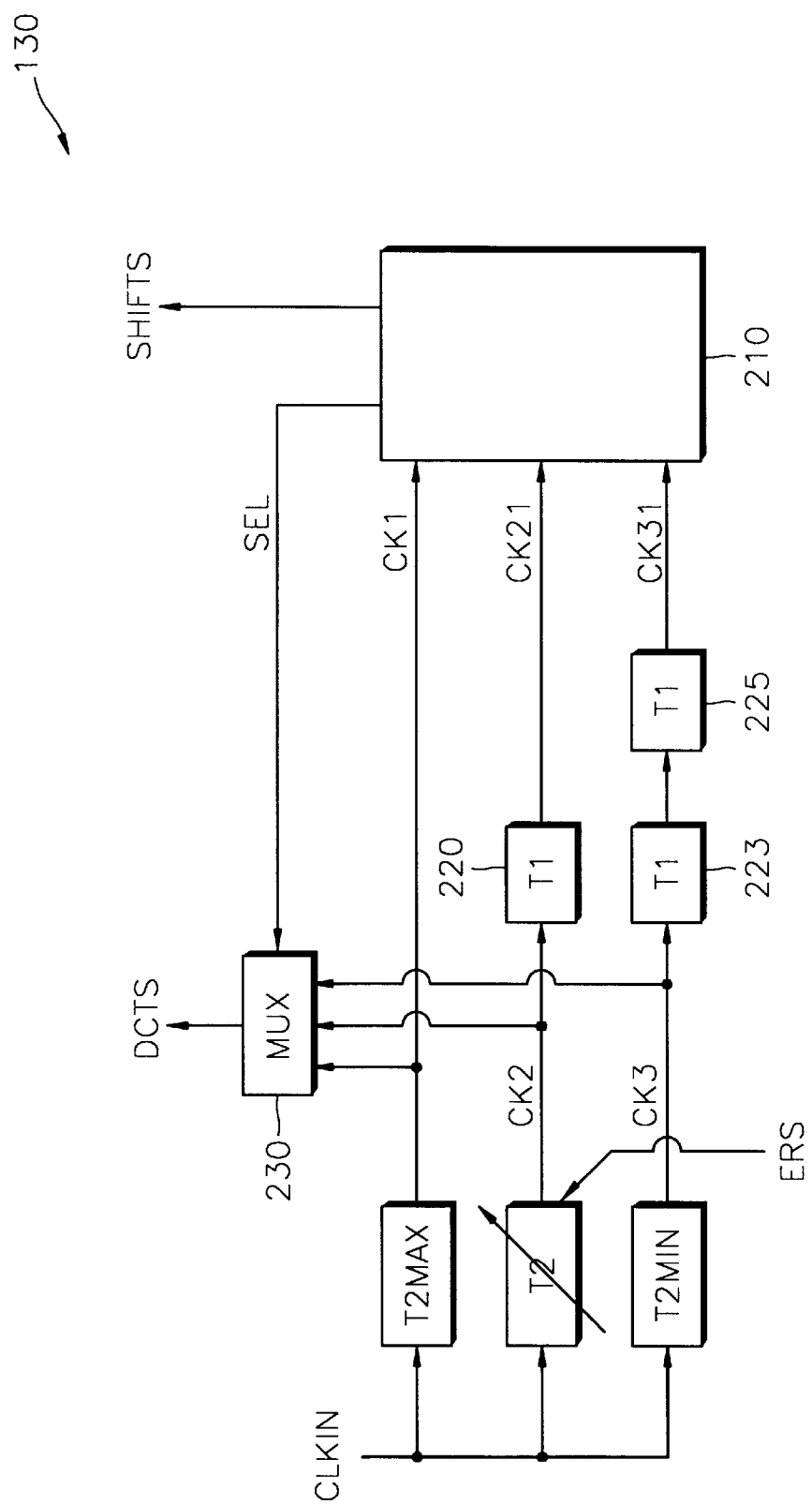
FIG. 2 is a block diagram illustrating a delay time controller shown in FIG. 1.

Referring to FIG. 2, the delay time adjuster 130 according to embodiments of the present invention includes a variable delay device T2, a maximum variable delay device T2MAX, a minimum variable delay device T2MIN, a multiplexer 230, and a controller 210.

The variable delay device T2 receives the reference clock signal CLKIN and variably delays the reference clock signal CLKIN in response to the error control signal ERS, thereby generating a variable delay signal CK2. The maximum variable delay device T2MAX receives the reference clock signal CLKIN and delays the reference clock signal CLKIN by as much as the maximum delay time of the variable delay device T2, thereby generating a maximum delay clock signal CK1. The minimum variable delay device T2MIN receives the reference clock signal CLKIN, and delays the reference clock signal by as much as the minimum delay time of the variable delay device T2, thereby generating a minimum delay signal CK3. The multiplexer 230 selects one signal from the variable delay signal CK2, the maximum delay clock signal CK1, and the minimum delay signal CK3 and outputs the selected signal as the input clock signal DCTS. The controller 210 compares a variable delay clock signal CK21, generated by passing the variable delay signal CK2 through a first delay device 220 to delay the variable delay signal CK2, with the maximum delay clock signal CK1 and a minimum delay clock signal CK31, generated by passing the minimum delay signal CK3 through 2 first delay devices 223 and 225 to delay the minimum delay signal CK3, thereby generating a shift signal SHIFTS and a selection signal SEL for controlling the multiplexer 230.

Hereinafter, the operation of the delay time adjuster 130 will be described more fully with reference to FIG. 2.

The variable delay device T2 varies the amount of delay provided to an input signal at intervals of a delay time of shorter duration than the delay time of each of the first delay devices T1 and generates the variable delay signal CK2. The variable delay signal CK2 is generated by variably delaying the phase of the reference clock signal CLKIN. The maximum variable delay device T2MAX has a fixed delay time which may be as long in duration as the maximum delay time to which the reference clock signal CLKIN can be delayed by the variable delay device T2. The minimum variable delay device T2MIN has a fixed delay time which may be as short in duration as the minimum delay time to which the reference clock signal CLKIN can be delayed by the variable delay device T2. Furthermore, the fixed delay time of the first delay devices T1 may be less than the difference between the maximum delay time to which the maximum variable delay device T2MAX can delay the phase of the reference clock signal CLKIN and the minimum delay time to which the minimum variable delay device T2MIN can delay the phase of the reference clock signal CLKIN.

The variable delay device T2 increases/decreases the delay time in response to the error control signal ERS. The controller 210 compares the variable delay clock signal CK21, generated by passing the variable delay signal CK2 through the first delay device 220 to delay the variable delay signal CK2, with the maximum delay clock signal CK1 and the minimum delay clock signal CK31, generated by passing the minimum delay signal CK3 through the 2 first delay devices 223 and 225 to delay the minimum delay signal CK3, thereby generating the shift signal SHIFTS and the selection signal SEL for controlling the multiplexer 230.

If the variable delay clock signal CK21 is behind the minimum delay clock signal CK31, the shift signal SHIFTS increases the number of first delay devices T1 by one. If the variable delay clock signal CK21 is ahead of the maximum delay clock signal CK1, the shift signal SHIFTS decreases the number of first delay devices T1 by one. If the variable delay clock signal CK21 is neither behind the minimum delay clock signal CK31 nor ahead of the maximum delay clock signal CK1, no change in the number of first delay devices T1 is made.

The multiplexer 230 selects one signal from the variable delay signal CK2, the maximum delay clock signal CK1, and the minimum delay signal CK3 in response to the predetermined selection signal SEL and generates the selected signal as the input clock signal DCTS. The SEL signal is generated by selecting the minimum delay signal CK3 if the variable delay clock signal CK21 is behind the minimum delay clock signal CK31, selecting the maximum delay signal CK1 if the variable delay clock signal CK21 is ahead of the maximum delay clock signal CK1 and selecting the variable delay signal CK2 if the variable delay clock signal CK21 is neither behind the minimum delay clock signal CK31 nor ahead of the maximum delay clock signal CK1.

Figure 3:
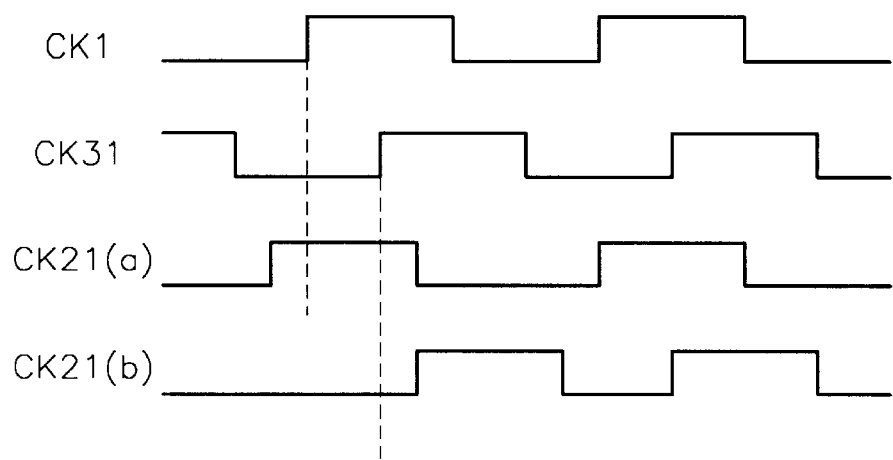
FIG. 3 is a timing diagram illustrating the operation of the delay time controller shown in FIG. 2.

As shown in FIG. 3, the variable delay clock signal CK21 is continuously sampled at the rising edges of the maximum delay clock signal CK1 and the minimum delay clock signal CK31. The phase of the variable delay signal CK2 varies continuously in response to the error control signal ERS generated in the phase detector 110 and, thus, the position of the rising edge of the variable delay clock signal CK21 changes.

If the rising edge of the variable delay clock signal CK21(a) is ahead of the rising edge of the maximum delay clock signal CK1, the variable delay clock signal CK21 sampled at the rising edge of the maximum delay clock signal CK1 becomes logic high. Then, the shift signal SHIFTS is generated in the controller 210 to decrease the number of first delay devices T1 by one and the selection signal SEL for selecting the maximum delay clock signal CK1 as the input clock signal DCTS is generated in the controller 210.

Embodiments of the present invention will now be described with reference to FIGS. 4 and 5 that illustrate operations of further embodiments of the present invention.

Figure 4:
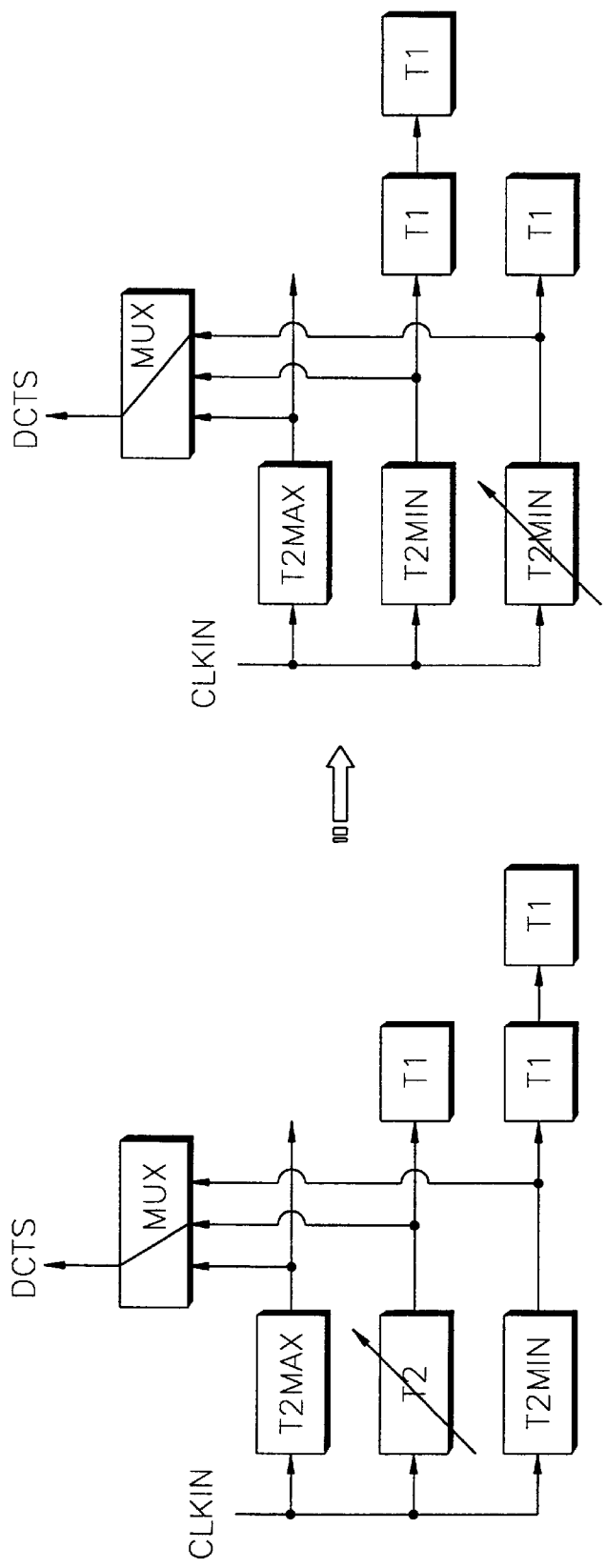
FIG. 4 is a diagram illustrating the operation of a delay time adjuster according to further embodiments of the present invention where the phase delay of a reference clock signal increases.
Figure 5:
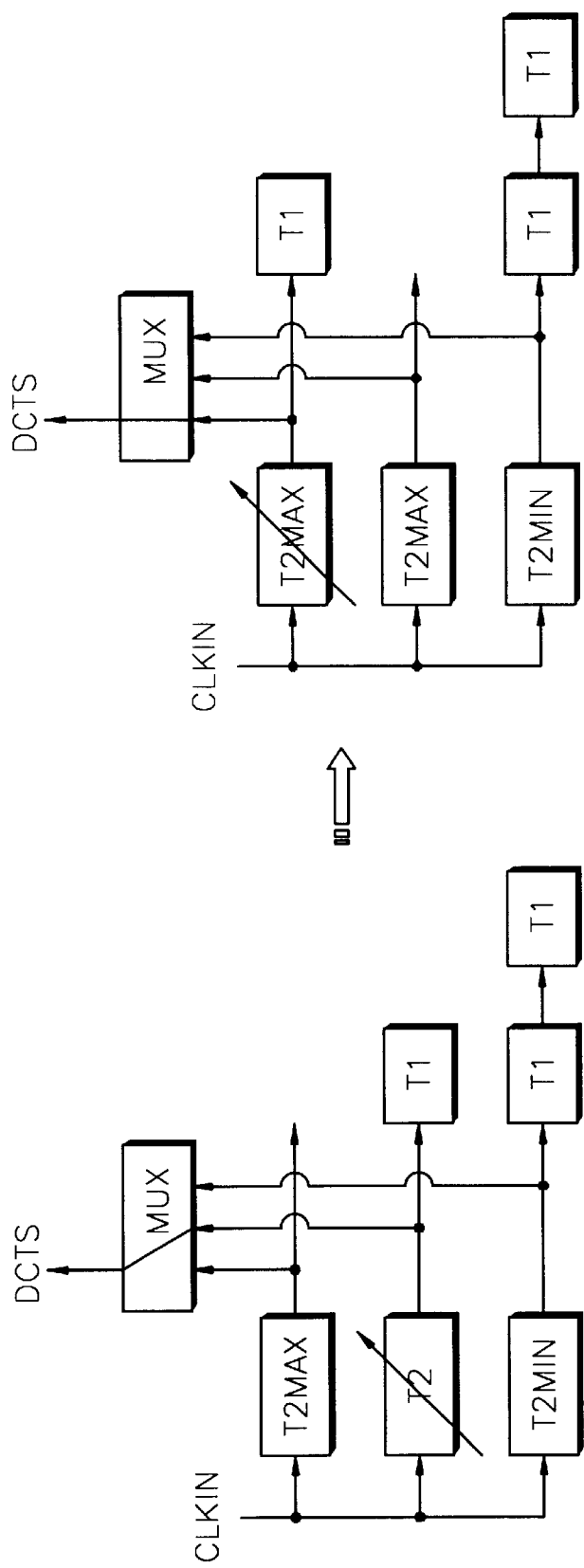
FIG. 5 is a diagram illustrating the operation of a delay time adjuster according to further embodiments of the present invention where the phase delay of a reference clock signal decreases.

FIG. 4 is a diagram illustrating the operation of the delay time adjuster 130 where the phase delay of the reference clock signal CLKIN increases, and FIG. 5 is a diagram illustrating the operation of the delay time adjuster 130 where the phase delay of the reference clock signal CLKIN decreases.

As illustrated in FIG. 5, the maximum variable delay device T2MAX acts as the variable delay device T2, and thus the delay time varies depending on the output of the error control signal ERS. Accordingly, the delay time of the original variable delay device T2 is set to the delay time of the maximum variable delay device T2MAX, and thus the original variable delay device T2 acts as the maximum variable delay device T2MAX. Therefore, even though the phase of the reference clock signal CLKIIN decreases by as much as the phase delay of the first delay devices T1, the decrease in the phase of the reference clock signal CLKIN is compensated for by as much as the phase of the maximum variable delay device T2MAX so that it is possible to precisely increase/decrease phase.

In a case where the phase of the reference clock signal CLKIN varies in response to the error control signal ERS, the phase delay of the maximum variable delay device T2MAX has already reached the maximum value, and thus it is impossible to increase the phase of the reference clock signal CLKIN more. To solve this, the maximum and minimum variable delay devices T2MAX and T2MIN are preferably set to have a value between the maximum value to which the phase of the variable delay device T2 can be varied and the minimum value to which the phase of the variable delay device T2 can be varied. In other words, the maximum variable delay device T2MAX is set to have a smaller phase than the maximum phase to which the variable delay device T2 can be varied, and the minimum variable delay device T2MIN is set to have a greater phase than the minimum phase to which the variable delay device T2 can be varied.

Figure 6:
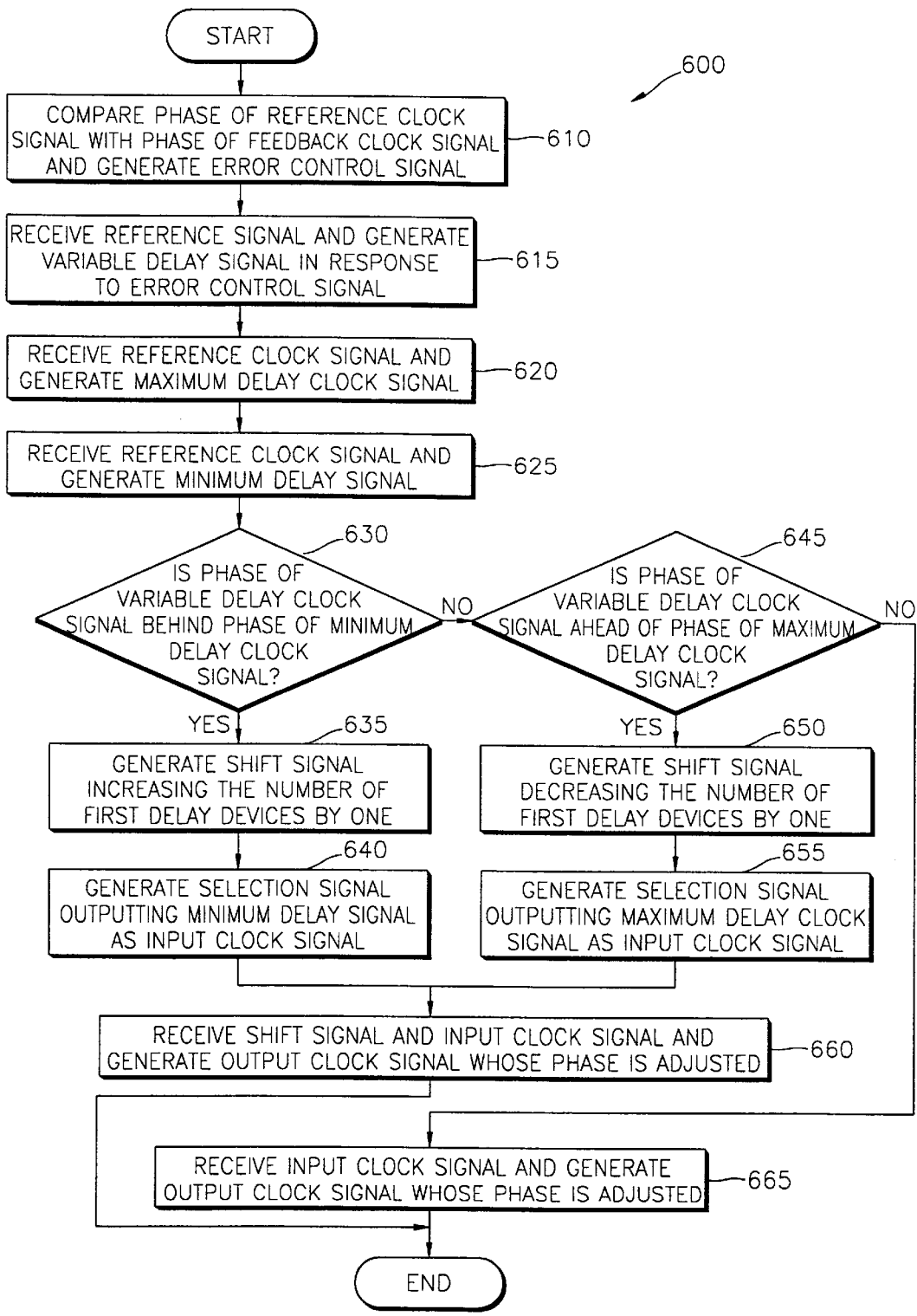
FIG. 6 is a flow chart illustrating operations according to embodiments of the present invention.

Referring to FIG. 6, in operations 600 for controlling the phase of a delay locked loop including a delay line in which a plurality of first delay devices each having a fixed delay time, are connected in series, the phase of a reference clock signal is compared with the phase of a feedback clock signal output from the delay line and the phase difference is output as an error control signal in block 610. In block 615, the reference clock signal is received and is variably delayed in response to the error control signal, thereby generating a variable delay signal. The variable delay signal is passed through one of the first delay devices so that the phase of the variable delay signal is delayed and a variable delay clock signal is generated. In block 620, the reference clock signal is received and delayed by as much as the maximum delay time to which the variable delay signal can be delayed, thereby generating a maximum delay clock signal. In block 625, the reference clock signal is received and delayed by as much as the minimum delay time to which the variable delay signal can be delayed, thereby generating a minimum delay signal. The minimum delay signal is passed through two of the first delay devices so that the phase of the minimum delay signal is delayed and a minimum delay clock signal is generated. The variable delay clock signal, the maximum delay clock signal, and the minimum delay clock signal are input to the controller shown in FIG. 2 and are compared with one another.

If the variable delay clock signal is behind the minimum delay clock signal, a shift signal for increasing the number of first delay devices by one is generated in blocks 630 through 635. At the same time, a selection signal for selecting the minimum delay signal as the input clock signal is generated in block 640. For example, in the embodiments of the present invention illustrated in FIG. 4, the minimum variable delay device T2MIN acts as the variable delay device T2 so that the delay time varies depending on the output of the error control signal ERS, and the original variable delay device T2 is fixed to the delay time of the minimum variable delay device T2MIN so that the original variable delay device T2 acts as the minimum variable delay device T2MIN. Accordingly, the phase of the reference clock signal CLKIN can be increased or decreased more precisely by the variable delay device having a smaller delay time interval than the delay time of the first delay devices in the delay line 120.

If the variable delay clock signal is ahead of the maximum delay clock signal, a shift signal for decreasing the number of first delay devices by one is generated in blocks 645 through 650. At the same time, a selection signal for selecting the maximum delay clock signal as the input clock signal is generated in block 655. For example, in the embodiments of the present invention illustrated in FIG. 5, the maximum variable delay device T2MAX acts as the variable delay device T2 so that the delay time varies depending on the output of the error control signal ERS, and the delay time of the original variable delay device T2 is set to the delay time of the maximum variable delay device T2MAX so that the original variable delay device T2 acts as the maximum variable delay device T2MAX. Accordingly, the phase of the reference clock signal CLKTN decreases by as much as the phase delay of the first delay devices, but the decrease in the phase of the reference clock signal CLKIN is compensated for by as much as the phase of the maximum variable delay device T2MAX. Thus, it is possible to increase or decrease the phase of the reference clock signal more precisely. In addition, jitter caused by the phase delay of the first delay devices can be reduced by the maximum variable delay device T2MAX.

The delay line receives the shift signal and the input clock signal and precisely controls the phase of the reference clock signal, thereby generating an output clock signal by in block 660. If the phase of the variable delay clock signal is not behind the phase of the minimum delay clock signal or is not ahead of the phase of the maximum delay clock signal, the phase of the reference clock signal is controlled by the variable delay device, for example, as shown in FIG. 2, thereby generating an output clock signal in block 665. Here, the fixed delay time of the first delay devices is less than a difference between the maximum delay clock signal and the minimum delay signal.

As described above, the delay locked loop and a method for precisely controlling the phase of an output clock signal of a delayed locked loop according to the present invention are advantageous in controlling an increase/decrease in the phase of the output clock signal of the delayed locked loop more precisely than delay devices of a delay line in the delay locked loop.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A delay locked loop receiving a reference clock signal and synchronizing a phase of the reference clock signal with a phase of a feedback clock signal, the delay locked loop comprising:

a phase detector configured to compare the phase of the reference clock signal with the phase of the feedback clock signal and outputting a value corresponding to a difference between the phase of the reference clock signal and the phase of the feedback clock signal as an error control signal;

a delay line including a plurality of first delay devices having a fixed delay time, selectively connected in series, and configured to adjust the number of first delay devices connected in series in response to a shift signal and to generate an output clock signal in response to an input clock signal; and a delay time adjuster configured to receive the reference clock signal and variably delay the reference clock signal in response to the error control signal to generate the input clock signal and the shift signal.

2. The delay locked loop of claim 1 further comprising a delay compensation circuit configured to compensate for the phase difference between the output clock signal and the feedback clock signal.

3. The delay locked loop of claim 1, wherein the delay time adjuster comprises:

a variable delay device configured to receive the reference clock signal and variably delay the reference clock signal in response to the error control signal so as to generate a variable delay signal;

a maximum variable delay device configured to receive the reference clock signal and delay the reference clock signal by a delay amount corresponding to the maximum delay time of the variable delay device to generate a maximum delay clock signal;

a minimum variable delay device configured to receive the reference clock signal and delay the reference clock signal by a delay amount corresponding to the minimum delay time of the variable delay device to generate a minimum delay signal;

a multiplexer that selects one signal from the variable delay signal, the maximum delay clock signal, and the minimum delay signal as the input clock signal; and a controller configured to compare a variable delay clock signal generated by delaying the variable delay signal the fixed delay time, with the maximum delay clock signal and a minimum delay clock signal generated by delaying the minimum delay signal twice the fixed delay time, to generate the shift signal and a selection signal that controls the multiplexer.

4. The delay locked loop of claim 3, wherein the fixed delay time of the first delay devices is less than a difference between the maximum delay time to which the maximum variable delay device delays the phase of the reference clock signal and the minimum delay time to which the minimum variable delay device delays the phase of the reference clock signal.

5. The delay locked loop of claim 3, wherein the controller is further configured to control the shift signal to increase the number of first delay devices by one if the variable delay clock signal is behind the minimum delay clock signal and control the shift signal to decrease the number of first delay devices by one if the variable delay clock signal is ahead of the maximum delay clock signal.

6. The delay locked loop of claim 3, wherein the controller is further configured to control the selection signal to select the minimum delay signal as the input clock signal when the shift signal is controlled to increase the number of first delay devices by one and to control the selection signal to select the maximum delay clock signal as the input clock signal when the shift signal is controlled to decrease the number of first delay devices by one.

7. The delay locked loop of claim 1, wherein each of the first delay devices in the delay line receives the input clock signal and a first input signal, selects one signal from the input clock signal and the first input signal, and supplies the selected signal to the next first delay device as the first input signal, and the output of a final first delay device in the delay line is generated as the output clock signal.

8. A phase control method of a delay locked loop including a delay line in which a plurality of first delay devices having a fixed delay time are connected in series, the method comprising:

comparing the phase of a reference clock signal with the phase of a feedback clock signal and outputting the phase difference between the reference clock signal and the feedback clock signal as an error control signal;

generating an input clock signal provided to the delay line by receiving the reference clock signal and variably delaying the reference clock signal in response to the error control signal;

generating a shift signal for controlling the number of first delay devices connected in series; and generating an output clock signal utilizing the delay line utilizing the input clock signal and the shift signal.

9. The method of claim 8, wherein the step of generating an input clock signal comprises:

variably delaying the reference clock signal in response to the error control signal to provide a variable delay signal;

delaying the reference clock signal by as much as the maximum delay time to which the variable delay signal can be delayed to provide a maximum delay clock signal;

delaying the reference clock signal by as much as the minimum delay time to which the variable delay signal can be delayed to provide a minimum delay signal;

comparing a variable delay clock signal, generated by delaying the variable delay signal an amount corresponding to the delay of one of the first delay devices to delay the variable delay signal, with the maximum delay clock signal and a minimum delay clock signal, generated by delaying the minimum delay signal an amount corresponding to a delay of two of the first delay devices to delay the minimum delay signal, and generating the shift signal and a selection signal; and selecting one signal from the variable delay signal, the maximum delay clock signal, and the minimum delay signal in response to the selection signal to provide the selected signal as the input clock signal.

10. The method of claim 9, wherein the step of comparing comprises:

increasing a number of first delay devices utilized in the delay line by one if the variable delay clock signal is behind the minimum delay clock signal;

selecting the minimum delay signal as the input clock signal if the variable delay clock signal is behind the minimum delay clock signal;

decreasing the number of first delay devices utilized in the delay line by one if the variable delay clock signal is ahead of the maximum delay clock signal; and selecting the maximum delay clock signal as the input clock signal if the variable delay clock signal is ahead of the maximum delay clock signal.

11. The method of claim 9, wherein a fixed delay time of the first delay devices is less than a difference between the maximum delay clock signal and the minimum delay signal.

* * * * *

UNITED STATES PATENT AND TRADEMARK OFFICE
CERTIFICATE OF CORRECTION

PATENT NO. : 6,670,835 B2
DATED : December 30, 2003
INVENTOR(S) : Yoo

It is certified that error appears in the above-identified patent and that said Letters Patent is hereby corrected as shown below:

<u>Title page,</u>
Item [56], References Cited, should include:
-- FOREIGN PATENT DOCUMENTS
JP      10294649      9/2001
OTHER PUBLICATIONS
Notice to Submit Response, Korean Application No. 10-2001-0021363, December 20, 2002. --

Signed and Sealed this

Fourth Day of May, 2004

JON W. DUDAS
*Acting Director of the United States Patent and Trademark Office*